(12) United States Patent
Lee (10) Patent No.: US 9,871,089 B2
(45) Date of Patent: Jan. 16, 2018

(54) DISPLAY DEVICE

(71) Applicant: Samsung Display Co., Ltd., Yongin-si, Gyeonggi-do (KR)

(72) Inventor: Wonse Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 39 days.

(21) Appl. No.: 14/971,834

(22) Filed: Dec. 16, 2015

(65) Prior Publication Data

US 2016/0372534 A1   Dec. 22, 2016

(30) Foreign Application Priority Data

Jun. 22, 2015  (KR) ........................ 10-2015-0088715

(51) Int. Cl.
*H01L 29/08* (2006.01)
*H01L 27/32* (2006.01)

(52) U.S. Cl.
CPC ...... *H01L 27/3276* (2013.01); *H01L 27/3248* (2013.01); *H01L 27/3258* (2013.01)

(58) Field of Classification Search
None
See application file for complete search history.

(56) References Cited

U.S. PATENT DOCUMENTS

| | | | | |
|---|---|---|---|---|
| 4,958,222 A * | 9/1990 | Takakura | ............ | H01L 23/5222 257/659 |
| 6,489,689 B2 * | 12/2002 | Nojiri | ................ | H01L 23/5222 257/207 |
| 2005/0272178 A1 | 12/2005 | Kim | | |
| 2013/0230961 A1 | 9/2013 | Kim et al. | | |
| 2014/0022230 A1 | 1/2014 | Hasumi et al. | | |
| 2015/0048344 A1 | 2/2015 | Han | | |
| 2016/0225840 A1 * | 8/2016 | Yamashita | ........... | G09G 3/3233 |

FOREIGN PATENT DOCUMENTS

| KR | 10-2005-0100775 A | 10/2005 |
|---|---|---|
| KR | 10-2012-0077575 A | 7/2012 |
| KR | 10-2014-0013902 A | 2/2014 |
| KR | 10-2015-0019951 A | 2/2015 |

* cited by examiner

*Primary Examiner* — Hung Vu
(74) *Attorney, Agent, or Firm* — Knobbe, Martens, Olson & Bear, LLP (57) ABSTRACT

A display device is disclosed. In one aspect, the display device includes a first power wire is disposed in a non-display area of a substrate and includes a first wiring extending in a first direction and a second wiring spaced apart from the first wiring. A second power wire is disposed in the non-display area and includes an extension portion extending in a second direction crossing the first direction, the extension portion located between the first and second wirings. A protective layer covers the first and second power wires, and a bridge wire is disposed on the protective layer and configured to electrically connect the first wiring to the second wiring. A vertical gap between the bridge wire and the extension portion is greater than a vertical gap between the bridge wire and the first wiring or a vertical gap between the bridge wire and the second wiring.

19 Claims, 5 Drawing Sheets

DISPLAY DEVICE

CROSS-REFERENCE TO RELATED APPLICATION

This application claims the benefit of Korean Patent Application No. 10-2015-0088715, filed on Jun. 22, 2015, in the Korean Intellectual Property Office, the disclosure of which is incorporated herein in its entirety by reference.

BACKGROUND

Field

The described technology generally relates to a display device.

Description of the Related Technology

Examples of display devices include liquid crystal display (LCDs), organic light-emitting diode (OLED) displays, plasma display panels (PDPs), etc. Recently, OLED displays are receiving much attention.

OLED displays, unlike LCDs, do not need a separate light source, and accordingly, their thickness and weight can be reduced. OLED technology has favorable characteristics, such as low power consumption, high luminance, and high response speed.

A voltage for driving an OLED display is applied by an external source, and is provided through a voltage interconnection wire formed in the display.

SUMMARY OF CERTAIN INVENTIVE ASPECTS

One inventive aspect relates to a display device.

Another aspect is a display device that includes: a substrate including a display area and a non-display area adjacent to the display area, the display area displaying an image through a plurality of pixels; a first power wire in the non-display area, the first power wire including a first wiring portion which extends in a first direction and a second wiring portion spaced apart from the first wiring portion; a second power wire in the non-display area, the second power wire including an extension portion extending in a second direction crossing the first direction between the first wiring portion and the second wiring portion; a protective layer covering the first power wire and the second power wire; and a bridge wire disposed on the protective layer and electrically connecting the first wiring portion to the second wiring portion, wherein a gap between the bridge wire and the extension portion is greater than a gap between the bridge wire and the first wiring portion or a gap between the bridge wire and the first wiring portion.

In an exemplary embodiment, an upper surface of the protective layer includes a flat surface.

In an exemplary embodiment, the first power wire and the second power wire include the same material.

In an exemplary embodiment, the display device further includes an insulating layer under the first power wire, wherein the insulating layer has a hole corresponding to a gap region between the first wiring portion and the second wiring portion, and the extension portion is located in the hole.

In an exemplary embodiment, the display device further includes a semiconductor layer under the insulating layer.

In an exemplary embodiment, the semiconductor layer directly contacts the extension portion.

In an exemplary embodiment, the size of the semiconductor layer is substantially equal to or greater than the size of the hole.

In an exemplary embodiment, the distance between the first wiring portion and the second wiring portion is greater than a width of the extension portion.

In an exemplary embodiment, the display area includes a plurality of pixels, and each of the pixels includes a thin film transistor including a semiconductor layer, a gate electrode, a source electrode, and a drain electrode; and a pixel electrode electrically connected to the thin film transistor.

In an exemplary embodiment, the bridge wire and the pixel electrode include the same material and are located on the same layer.

In an exemplary embodiment, the display device further includes a connection electrode electrically connecting one of the source electrode and the drain electrode to the pixel electrode, the first power wire and the second power wire located at the same level as the connection electrode.

In an exemplary embodiment, the display device further includes an emission layer on the pixel electrode; and an opposite electrode on the emission layer.

In an exemplary embodiment, the display device includes one of the first power wire and the second power wire is electrically connected to the thin film transistor, and the other wire is electrically connected to the opposite electrode.

In an exemplary embodiment, the extension portion is disposed in a first plane, and the first wiring portion and the second wiring portion are disposed in a second plane which is different with the first plane.

Another aspect is a display device, comprising: a substrate including a display area and a non-display area located adjacent to the display area, wherein the display area includes a plurality of pixels configured to display an image; a first power wire disposed in the non-display area and including a first wiring extending in a first direction and a second wiring spaced apart from the first wiring; a second power wire disposed in the non-display area and including an extension portion extending in a second direction crossing the first direction, wherein the extension portion is located between the first and second wirings; a protective layer covering the first and second power wires; and a bridge wire disposed on the protective layer and configured to electrically connect the first wiring to the second wiring, wherein a vertical gap between the bridge wire and the extension portion is greater than a vertical gap between the bridge wire and the first wiring or a vertical gap between the bridge wire and the second wiring.

In the above display device, the protective layer includes a substantially flat upper surface.

In the above display device, the first and second power wires include the same material.

The above display device further comprises an insulating layer disposed under the first power wire, wherein the insulating layer has a hole corresponding to a gap region located between the first and second wirings, and wherein the extension portion is located in the hole.

The above display device further comprises a semiconductor layer disposed under the insulating layer.

In the above display device, the semiconductor layer directly contacts the extension portion.

In the above display device, the size of the semiconductor layer is substantially equal to or greater than the size of the hole.

In the above display device, the distance between the first and second wirings is greater than the width of the extension portion.

In the above display device, each of the pixels comprises: a thin film transistor comprising a semiconductor layer, a gate electrode, a source electrode, and a drain electrode; and a pixel electrode electrically connected to the thin film transistor.

In the above display device, the bridge wire and the pixel electrode include the same material and are located on the same layer.

The above display device further comprises a connection electrode configured to electrically connect one of the source and drain electrodes to the pixel electrode, wherein the first and second power wires are located on the same layer as the connection electrode.

The above display device further comprises: an emission layer disposed on the pixel electrode; and an opposite electrode disposed on the emission layer.

In the above display device, one of the first and second power wires is electrically connected to the thin film transistor, wherein the other wire is electrically connected to the opposite electrode.

In the above display device, the extension portion is disposed in a first plane, wherein the first and second wirings are disposed in a second plane different from the first plane.

Another aspect is a display device, comprising: a substrate including a display area and a non-display area located adjacent to the display area; a first power wire disposed in the non-display area and including a first wiring extending in a first direction and a second wiring spaced apart from the first wiring; a second power wire disposed in the non-display area and including an extension portion extending in a second direction crossing the first direction, wherein the extension portion is located between the first and second wirings; and a bridge wire disposed over the first and second wirings and configured to electrically connect the first wiring to the second wiring, wherein the shortest distance between the bridge wire and the extension portion is greater than the shortest distance between the bridge wire and the first wiring or the shortest distance between the bridge wire and the second wiring.

In the above display device, the bridge wire is farther from the substrate than the extension portion.

In the above display device, the first and second wirings are closer to the bridge wire than the extension portion.

In the above display device, the first and second wirings are spaced apart from a top surface of the bridge wire at substantially the same distance.

In the above display device, the distance between the first and second wirings defined in the first direction is greater than the width of the extension portion defined in the first direction.

DETAILED DESCRIPTION OF CERTAIN INVENTIVE EMBODIMENTS

The present disclosure will now be described more fully with reference to exemplary embodiments. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Advantages, features, and how to achieve them of the will become apparent by reference to the embodiment that will be described later in detail, together with the accompanying drawings. The described technology may, however, be embodied in many different forms and should not be limited to the exemplary embodiments.

Hereinafter, embodiments are described in detail by referring to the attached drawings, and in the drawings, like reference numerals denote like elements, and a redundant explanation thereof will not be provided herein.

As used herein, the terms as "first", "second", etc., are used only to distinguish one component from another, and such components should not be limited by these terms.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, area, or component is referred to as being "on" or "onto" another layer, area, or component, it may be directly or indirectly formed on the other layer, area, or component. That is, for example, intervening layers, areas, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When an embodiment can be implemented in a manner different from what is described herein, a particular process sequence may be performed in a manner different from what is described herein. For example, two processes, which are explained consecutively, may be performed substantially at the same time, or in some cases, the processes may be performed in a reverse sequence.

It will be understood that when a layer, area, or component is referred to as being connected to another layer, area, or component, it may be directly or indirectly connected to the other layer, area, or component. That is, for example, intervening layers, areas, or components may be present. It will be understood that when a layer, area, or component is referred to as being electrically connected to another layer, area, or component, it may be directly or indirectly, electrically connected to the other layer, area, or component. That is, for example, intervening layers, areas, or components may be present.

As used herein, the term "and/or" includes any and all combinations of one or more of the associated listed items. In this disclosure, the term "substantially" includes the meanings of completely, almost completely or to any significant degree under some applications and in accordance with those skilled in the art. The term "connected" can include an electrical connection.

Figure 1:
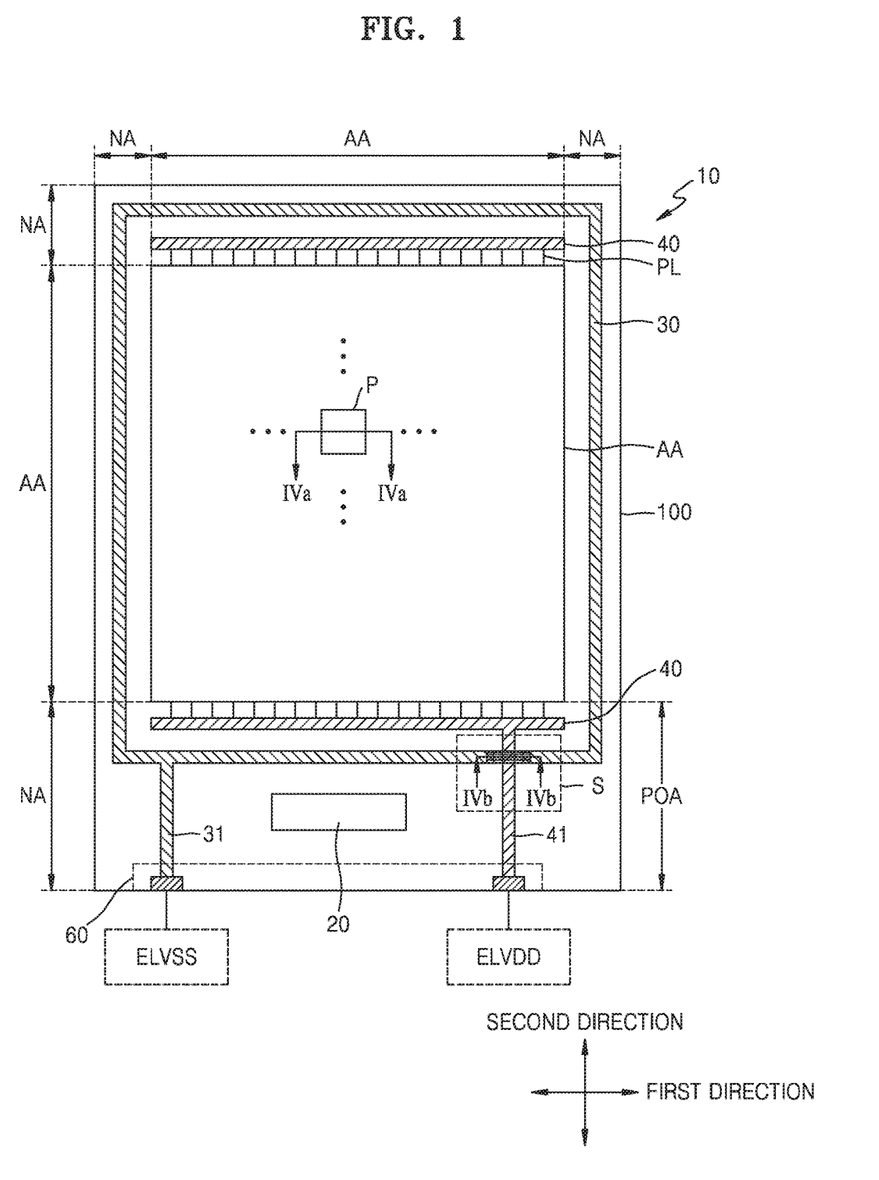
FIGS. 1 and 2 are schematic plan views of a display device according to an embodiment.
Figure 2:
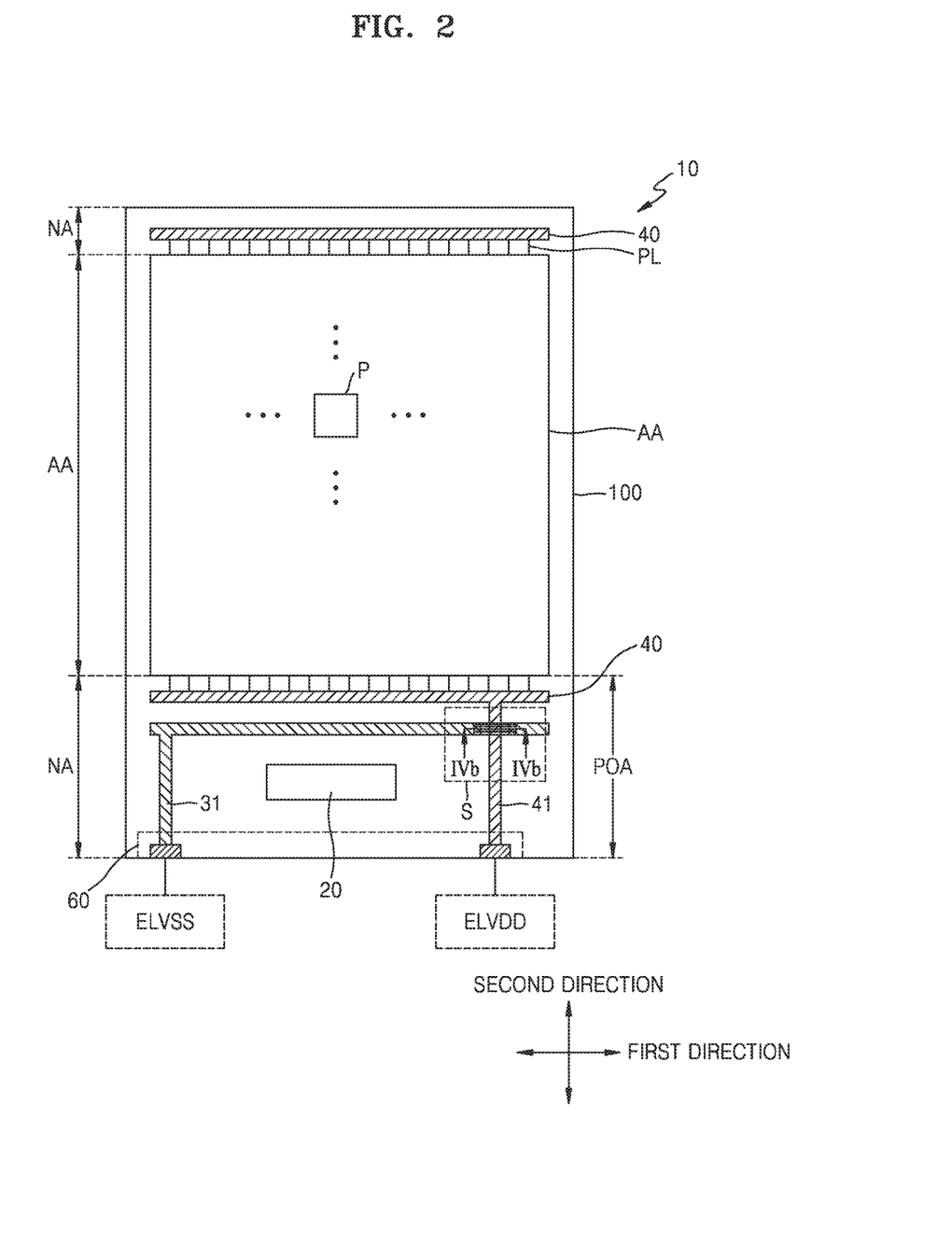
Figure 3:
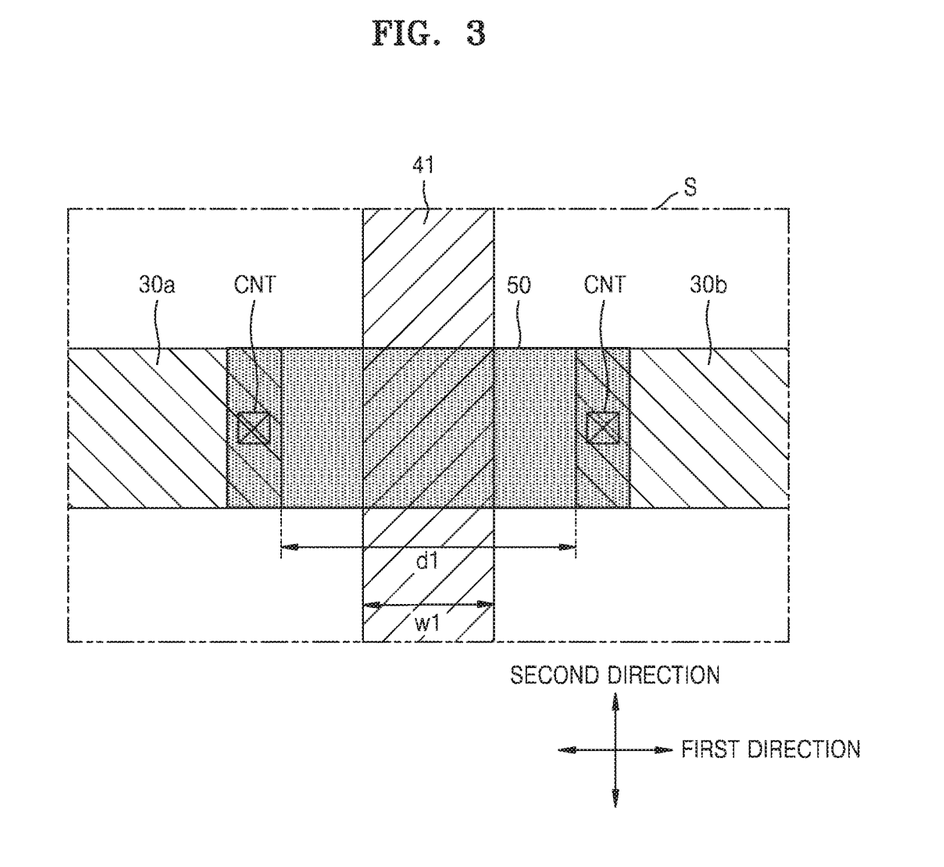
FIG. 3 is a plan view of portion S of FIGS. 1 and 2.

FIGS. 1 and 2 are schematic plan views of a display device 10 according to an embodiment. FIG. 3 is a plan view of portion S of FIGS. 1 and 2.

Referring to FIGS. 1 and 2, the display device 10 includes a substrate 100 having a display area AA and a non-display area NA. The substrate 100 may be formed of a glass material, a metallic material, or a plastic material. Examples of the plastic material are polyethylene terephthalate (PET), polyethylene naphthalate (PEN), and polyimide.

The display area AA includes a plurality of pixels P configured to display images. Each of the pixels P may include a pixel circuit (not shown) and a display element that emits light when a driving voltage is applied thereto through the pixel circuit. An example of the display element is an organic light-emitting diode (OLED) that includes a pixel electrode (see 310 of FIG. 4) and an opposite electrode (see 330 of FIG. 4) facing each other, and an emission layer (see 320 of FIG. 4) located between the pixel electrode and the opposite electrode.

The non-display area NA may be adjacent to the display area AA. In some embodiments, as illustrated in FIG. 1, the non-display area NA surrounds the display area AA. Although in the embodiment illustrated in FIG. 1, the non-display area NA surrounds the display area AA, embodiments are not limited thereto. In some embodiments, as illustrated in FIG. 2, the non-display area NA may be adjacent to the display area AA only on facing sides thereof, so that the non-display area NA occupies less space in the display device 10. In some embodiments, although not illustrated herein, the non-display area NA is located adjacent to the display area AA only on a single side thereof.

A driving circuit 20 may be located in the non-display area NA, and generates scan signals and/or data signals in correspondence to driving power and/or driving signals provided by a pad unit 60, and supplies the scan signals and/or data signals to the pixel P. The driving circuit 20 may include a scan driving unit and/or a data driving unit. The driving circuit 20 may be formed together with the pixel P during when the pixel P is formed. In some embodiments, the driving circuit 20 may be mounted as an integrated circuit (IC) chip on the substrate 100.

A first power wire 30 may be located in the non-display area NA, and a first power voltage ELVSS may be provided to the opposite electrode of the OLED therethrough. In some embodiments, the opposite electrode formed on the entire surface of the substrate 100 is connected to the first power wire 30 in the non-display area NA, and accordingly, the first power voltage ELVSS may be provided to an opposite electrode 330 through the first power wire 30.

The first power wire 30 may at least partially surround the non-display area NA. In some embodiments, the first power wire 30, as illustrated in FIG. 1, completely surrounds the display area AA. In some embodiments, the first power wire 30, as illustrated in FIG. 2, is located on a side of the display area AA to partially surround the display area AA.

A second power wire 40 may be located in the non-display area NA, and a second power voltage ELVDD may be applied to the pixel P. In some embodiments, the second power wire 40 further includes auxiliary lines PL crossing the display area AA, and through the auxiliary lines PL, the second power voltage ELVDD may be provided to the pixel P in the display area AA.

The second power wire 40 may at least partially surround the non-display area NA. In some embodiments, the second power wire 40 may be located on opposing sides of the display area AA, as illustrated in FIGS. 1 and 2. In some embodiments, like the first power wire 30 illustrated in FIG. 1, the second power wire 40 completely surrounds the display area AA, or like the second power wire 40 illustrated in FIG. 2, the second power wire 40 is located on a side of the display area AA.

The first power wire 30 and the second power wire 40 may respectively include a first extension portion 31 and a second extension portion 41, which are both located in a pull-off area POA. Each of the first extension portion 31 and the second extension portion 41 may extend toward the pad unit 60, and the first power voltage ELVSS and the second power voltage ELVDD may be respectively applied to the first power wire 30 and the second power wire 40 through the first extension portion 31 and the second extension portion 41. The pull-off area POA is a portion of the non-display area NA which is adjacent to the display area AA. The pull-off area POA is an area where a wire connected to the display area AA may pass through or may be formed.

A portion of the first power wire 30, as illustrated in FIG. 1, extends in a first direction, and the second extension portion 41 of the second power wire 40 extends in a second direction, thereby forming an intersection, which is located in the pull-off area POA. The first power wire 30 and the second power wire 40 may have different voltage levels, and a predetermined voltage is applied to the opposite electrode and the pixel electrode of the OLED through the first power wire 30 and the second power wire 40. Accordingly, to prevent the occurrence of a short-circuit between the first power wire 30 and the second power wire 40, the first power wire 30 may use the bridge wire 50.

Referring to FIG. 3, the first power wire 30 includes a first wiring portion 30a extending in the first direction and a second wiring portion 30b spaced apart from the first wiring portion 30a. Between the first wiring portion 30a and the second wiring portion 30b spaced apart from each other, the second extension portion 41 of the second power wire 40 may extend in the second direction. A distance d1 between the first wiring portion 30a and the second wiring portion 30b may be greater than a width w1 of the second extension portion 41, so that a short-circuit between the second extension portion 41 and the first and second wiring portions 30a and 30b may be prevented. The first wiring portion 30a and the second wiring portion 30b may be electrically connected to each other through the bridge wire 50. The bridge wire 50 may be located at a level or plane different from those of the first and second wiring portions 30a and 30b of the first power wire 30 and the second extension portion 41 of the second power wire 40.

Figure 4:
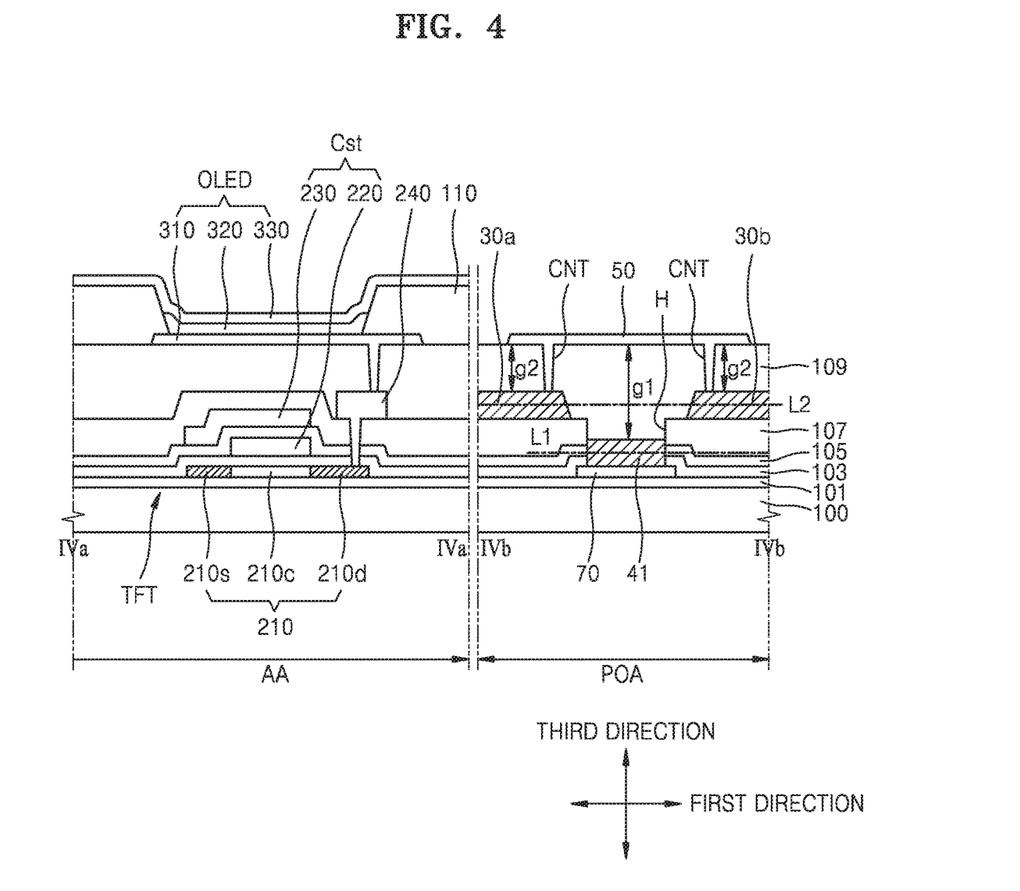
FIG. 4 is a cross-sectional view taken along line IVa-IVa and line IVb-IVb of FIGS. 1 and 2.

FIG. 4 is a cross-sectional view taken along line IVa-IVa and line IVb-IVb of FIGS. 1 and 2.

Referring to FIG. 4, the pixel P of the display area AA may include a thin film transistor TFT, a storage capacitor Cst, and an OLED electrically connected to the thin film transistor TFT and the storage capacitor Cst. The first and second wiring portions 30a and 30b of the first power wire 30, connected to each other through the bridge wire 50, and the second extension portion 41 of the second power wire 40 passing through a gap region between the first and second wiring portions 30a and 30b are located in the pull-off area POA.

A buffer layer 101 may be formed on the substrate 100, and the thin film transistor TFT and the storage capacitor Cst may be formed on the buffer layer 101. The buffer layer 101 may be formed of an insulating material, such as silicon oxide or silicon nitride, to prevent permeation of impurities into the thin film transistor TFT and the storage capacitor Cst.

The thin film transistor TFT may include an active layer 210 and a gate electrode 220 on the active layer 210. A gate insulating film 103 is located between the active layer 210 and the gate electrode 220. The gate insulating film 103 may be formed of an insulating material, such as silicon oxide or silicon nitride. The active layer 210 may include a channel area 210c overlapping with the gate electrode 220 and a source area 210s and a drain area 210d, which are doped areas, located on both sides of the channel area 210c. The source area 210s is corresponding to a source electrode and the drain area 210d is corresponding to a drain electrode.

The storage capacitor Cst may be formed on the thin film transistor TFT. The storage capacitor Cst may include a lower electrode 220 which is also the gate electrode 220 of the thin film transistor TFT, and an upper electrode 230. The upper electrode 230 may be arranged to overlap with the lower electrode 220 with a dielectric layer 105 disposed therebetween. In the present embodiment, the storage capacitor Cst and the thin film transistor TFT overlap each other. However, embodiments are not limited thereto. The storage capacitor Cst may not overlap with the thin film transistor TFT. In non-limiting embodiments, the lower electrode, i.e., the lower electrode and the upper electrode of the storage capacitor Cst may be located at the same levels (layers) as those of the active layer 210 and a gate electrode, respectively, and the gate insulating film 103 may be used as a dielectric.

A pixel electrode 310 may be electrically connected to one of the source area 210s and the drain area 210d of the thin film transistor TFT. In some embodiments, the pixel electrode 310 is electrically connected to the thin film transistor TFT through a connection electrode 240. The connection electrode 240 may be disposed above the gate electrode 220 with an interlayer insulating film 107 therebetween, and may be covered by a protection layer (or protective layer) 109. The interlayer insulating film 107 may be formed of an insulating material, such as silicon oxide or silicon nitride. The protection layer 109 may be a planarization film having a flat upper surface, and may be an inorganic insulating film and/or an organic insulating film.

The connection electrode 240 may be formed of at least one metal of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tungsten (W), and copper (Cu). The pixel electrode 310 may be a reflective electrode or a transparent or semi-transparent electrode. A pixel-defining film 110 may be formed on the pixel electrode 310. The pixel-defining film 110 has an opening that exposes an upper portion of the pixel electrode 310, and an emission layer 320 may be located in the opening of the pixel-defining film 110.

The emission layer 320 may be formed of a low-molecular weight organic material and/or a polymer organic material, which may emit red, green, blue or white light. At least one of a hole injection layer (HTL), a hole transport layer (HTL), an electron transport layer (ETL), and an electron injection layer (EIL) may be further disposed on the emission layer 320.

The opposite electrode 330 may completely cover the substrate 100, and as explained in connection with FIG. 1, the opposite electrode 330 may be connected to the second power wire 40 through which the second power voltage ELVSS is applicable thereto. The opposite electrode 330 may be a transparent or semi-transparent electrode or a reflective electrode.

In the non-display area NA, the first power wire 30 and the second power wire 40 are located, and in the pull-off area POA, the first power wire 30 and the second power wire 40 may cross each other. In some embodiments, the first power wire 30 and the second power wire 40 are formed during the same mask process as used to form the connection electrode 240, and are formed of the same material as the connection electrode 240. That is, the first and second wiring portions 30a and 30b of the first power wire 30, the second extension portion 41 of the second power wire 40 and the connection electrode 240 may be formed of the same material and located on the same level (layer).

The first wiring portion 30a and the second wiring portion 30b disposed on the interlayer insulating film 107 are spaced apart from each other by the distance d1, covered by the protection layer 109, and are electrically connected to each other through the bridge wire 50 disposed on the protection layer 109. The bridge wire 50 may be formed during the same mask process as used to form the pixel electrode 310, and may include the same material as that included in the pixel electrode 310. The bridge wire 50 may be connected to the first wiring portion 30a and the second wiring portion 30b through a contact hole CNT passing through the protection layer 109.

The second extension portion 41 of the second power wire 40 extends between the first wiring portion 30a and the second wiring portion 30b, and may be located in a hole H corresponding to a gap region between the first wiring portion 30a and the second wiring portion 30b. In some embodiments, the hole H passes through the interlayer insulating film 107, or through the interlayer insulating film 107 and the dielectric layer 105, or through the interlayer insulating film 107, the dielectric layer 105, and the gate insulating film 103. The hole H may pass through at least one of the interlayer insulating film 107, the dielectric layer 105, and the gate insulating film 103, which are all disposed under the first wiring portion 30a and the second wiring portion 30b, and the second extension portion 41 is located in the hole H, and accordingly, regarding a third direction, a first gap g1 between the second extension portion 41 and the bridge wire 50 may be greater than a second gap g2 between each of the first and second wiring portions 30a and 30b and the bridge wire 50. Since the first gap g1 is greater than the second gap g2, a short-circuit between the bridge wire 50 and the second extension portion 41 may be minimized.

Under the second extension portion 41 in the hole H, a semiconductor layer 70 may be disposed. The size of the semiconductor layer may be substantially equal to or greater than the size of the hole. In some embodiments, the semiconductor layer 70 is formed in the same mask process as used to form the active layer 210 of the thin film transistor TFT located in the display area AA. The semiconductor layer 70 is disposed between the buffer layer 101 and the gate insulating film 103. The semiconductor layer 70 may prevent the buffer layer 101 and the substrate 100 from being damaged when the hole H is formed passing through insulating layers disposed at a level lower than those of the first and second wiring portions 30a and 30b, for example, the gate insulating film 103, the dielectric layer 105, and the interlayer insulating film 107. In some embodiments, the hole H is formed by dry-etching, and the semiconductor layer 70 functions as a blocking layer to protect the buffer layer 101 and the substrate 100 from, for example, plasma used for etching.

Figure 5:
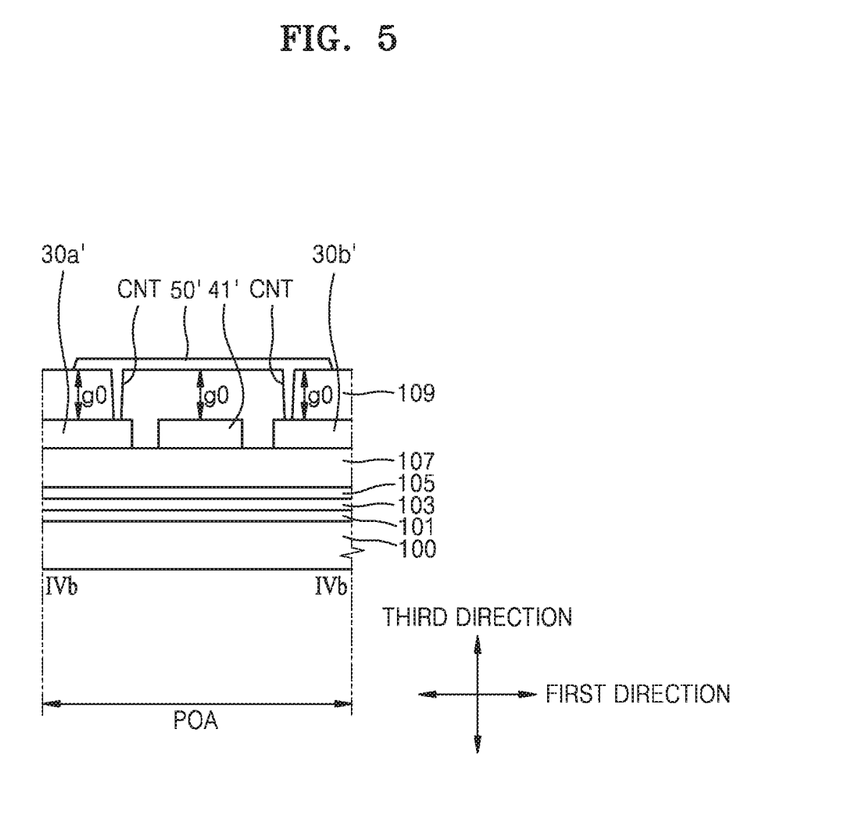
FIG. 5 is a cross-sectional view of a pull-off area of a display device according to Comparative Embodiment.

FIG. 5 is a cross-sectional view of the pull-off area POA of a display device according to Comparative Embodiment. The display device according to the Comparative Embodiment illustrated in FIG. 5 has a similar structure as the display device 10 explained with reference to FIG. 4, except that a hole is not formed passing through insulating layers located at a level lower than those of a first wiring portion 30a' and a second wiring portion 30b'.

Referring to FIG. 5, the buffer layer 101, the gate insulating film 103, the dielectric layer 105, and the interlayer insulating film 107 are sequentially formed in this stated order on the substrate 100, and then, the first and second wiring portions 30a' and 30b' of the first power wire 30 and a second extension portion 41' of the second power wire 40 are formed in the same mask process. Thereafter, the protection layer 109, which is a planarization film, is formed, and contact holes CNT exposing the first and second wiring portions 30a and 30b are formed, and then, a the bridge wire 50' is formed to allow the first and second wiring portions 30a' and 30b' to be electrically connected to each other.

In the case of the display device according to Comparative Embodiment, the gap between the bridge wire 50' and the first and second wiring portions 30a' and 30b' is substantially equal to the gap between the bridge wire 50' and the second extension portion 41', wherein the gaps all are indicated as g0, and accordingly, a short-circuit may occur between the bridge wire 50' and the second extension portion 41', to which different voltages are applied.

In addition, the first and second wiring portions 30a' and 30b' and the second extension portion 41' are located on the same plane. Accordingly, a short-circuit may occur horizontally, that is, in the first direction. For example, ends of the first and second wiring portions 30a' and 30b' are located adjacent to an end of the second extension portion 41', and accordingly, along the first direction which is a horizontal direction, a short-circuit may occur between the first wiring portion 30a' and the second extension portion 41' or/and between the second wiring portion 30b' and the second extension portion 41'.

However, in the case of the display device 10 explained in connection with FIGS. 1 to 4, the second extension portion 41 is located in the hole H, and accordingly, the second extension portion 41 may be located on a plane lower than a plane on which the first and second wiring portions 30a and 30b are disposed. That is, a first plane L1 on which the second extension portion 41 is disposed may be different from a second plane L2 on which the first and second wiring portions 30a and 30b are disposed. Herein, the first plane L1 and the second plane L2 indicate imaginary planes which are parallel to the substrate 100.

According to the embodiments explained with reference to FIGS. 1 to 4, the ends of the first and second wiring portions 30a and 30b are spaced apart from the end of the second extension portion 41 in the first and third directions. Accordingly, the possibility that a short-circuit occurs between the first wiring portion 30a and the second extension portion 41 and/or between the second wiring portion 30b and the second extension portion 41 may be minimized or lessened, and the possibility that a short-circuit occurs between the bridge wire 50 and the second extension portion 41 may be minimized or lessened.

According to at least one of the disclosed embodiments, the first power wire 30 allows the first power voltage ELVSS to be applied and the second power wire 40 allows the second power voltage ELVDD to be applied. However, embodiments are not limited thereto. In other embodiments, the first power wire 30 allows the second power voltage ELVDD to be applied and the second power wire 40 allows the first power voltage ELVSS to be applied.

A display device according to embodiments effectively prevents a short-circuit between a first power wire and a second power wire in a non-display region.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details may be made therein without departing from the spirit and scope as defined by the following claims.

What is claimed is:

1. A display device, comprising:
   a substrate including a display area and a non-display area located adjacent to the display area, wherein the display area includes a plurality of pixels configured to display an image;
   a first power wire disposed in the non-display area and including a first wiring extending in a first direction and a second wiring spaced apart from the first wiring;
   a second power wire disposed in the non-display area and including an extension portion extending in a second direction crossing the first direction, wherein the extension portion is located between the first and second wirings;
   a protective layer covering the first and second power wires; and
   a bridge wire disposed on the protective layer and configured to electrically connect the first wiring to the second wiring,
   wherein a gap between the bridge wire and the extension portion in a third direction which is perpendicular to the first and second directions is greater than a gap between the bridge wire and the first wiring in the third direction or a gap between the bridge wire and the second wiring in the third direction.

2. The display device of claim 1, wherein the protective layer includes a substantially flat upper surface.

3. The display device of claim 1, wherein the first and second power wires include the same material.

4. The display device of claim 1, further comprising an insulating layer disposed under the first power wire,
   wherein the insulating layer has a hole corresponding to a gap region located between the first and second wirings, and
   wherein the extension portion is located in the hole.

5. The display device of claim 4, further comprising a semiconductor layer disposed under the insulating layer.

6. The display device of claim 5, wherein the semiconductor layer directly contacts the extension portion.

7. The display device of claim 5, wherein the size of the semiconductor layer is substantially equal to or greater than the size of the hole.

8. The display device of claim 1, wherein the distance between the first and second wirings is greater than the width of the extension portion.

9. The display device of claim 1, wherein each of the pixels comprises:
   a thin film transistor comprising a semiconductor layer, a gate electrode, a source electrode, and a drain electrode; and
   a pixel electrode electrically connected to the thin film transistor.

10. The display device of claim 9, wherein the bridge wire and the pixel electrode include the same material and are located on the same layer.

11. The display device of claim 9, further comprising a connection electrode configured to electrically connect one of the source and drain electrodes to the pixel electrode, wherein the first and second power wires are located on the same layer as the connection electrode.

12. The display device of claim 9, further comprising:
an emission layer disposed on the pixel electrode; and
an opposite electrode disposed on the emission layer.

13. The display device of claim 12, wherein one of the first and second power wires is electrically connected to the thin film transistor, and wherein the other wire is electrically connected to the opposite electrode.

14. The display device of claim 1, wherein the extension portion is disposed in a first plane, and
wherein the first and second wirings are disposed in a second plane different from the first plane.

15. A display device, comprising:
a substrate including a display area and a non-display area located adjacent to the display area;
a first power wire disposed in the non-display area and including a first wiring extending in a first direction and a second wiring spaced apart from the first wiring;
a second power wire disposed in the non-display area and including an extension portion extending in a second direction crossing the first direction, wherein the extension portion is located between the first and second wirings; and
a bridge wire disposed over the first and second wirings and configured to electrically connect the first wiring to the second wiring,
wherein the shortest distance between the bridge wire and the extension portion is greater than the shortest distance between the bridge wire and the first wiring or the shortest distance between the bridge wire and the second wiring.

16. The display device of claim 15, wherein the bridge wire is farther from the substrate than the extension portion.

17. The display device of claim 16, wherein the first and second wirings are closer to the bridge wire than the extension portion.

18. The display device of claim 17, wherein the first and second wirings are spaced apart from a top surface of the bridge wire at substantially the same distance.

19. The display device of claim 15, wherein the distance between the first and second wirings defined in the first direction is greater than the width of the extension portion defined in the first direction.

* * * * *